(12) United States Patent
Nakatani et al.

(10) Patent No.: US 9,368,469 B2
(45) Date of Patent: Jun. 14, 2016

(54) ELECTRONIC COMPONENT PACKAGE AND METHOD OF MANUFACTURING SAME

(71) Applicant: Panasonic Intellectual Property Management Co., Ltd., Osaka (JP)

(72) Inventors: Seiichi Nakatani, Osaka (JP); Yoshihisa Yamashita, Kyoto (JP); Koji Kawakita, Nara (JP); Susumu Sawada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/397,289

(22) PCT Filed: Aug. 2, 2013

(86) PCT No.: PCT/JP2013/004706
§ 371 (c)(1),
(2) Date: Oct. 27, 2014

(87) PCT Pub. No.: WO2014/034024
PCT Pub. Date: Mar. 6, 2014

(65) Prior Publication Data
US 2015/0076545 A1    Mar. 19, 2015

(30) Foreign Application Priority Data

Aug. 30, 2012  (JP) ................................. 2012-190075
Sep. 5, 2012   (JP) ................................. 2012-195161

(51) Int. Cl.
*H01L 23/02*    (2006.01)
*H01L 33/48*    (2010.01)
(Continued)

(52) U.S. Cl.
CPC ............ *H01L 24/27* (2013.01); *H01L 21/4821* (2013.01); *H01L 23/02* (2013.01);
(Continued)

(58) Field of Classification Search
CPC ...... H01L 24/27; H01L 23/02; H01L 21/4821
USPC .............................................. 438/113; 257/98
See application file for complete search history.

(56) References Cited

U.S. PATENT DOCUMENTS 5,497,033 A * 3/1996 Fillion .................. H01L 21/568
                                                           257/700
5,607,779 A * 3/1997 Naoi ..................... C23C 28/321
                                                           428/634
(Continued)

FOREIGN PATENT DOCUMENTS

JP      11-126863       5/1999
JP      2000-323510    11/2000
(Continued)

OTHER PUBLICATIONS

Machine Translation of JP 2003-017757 having a publication date of Jan. 17, 2003.
(Continued)

*Primary Examiner* — Moazzam Hossain
(74) *Attorney, Agent, or Firm* — Wenderoth, Lind & Ponack, L.L.P.

(57) ABSTRACT

There is provided a method for manufacturing an electronic component package. The method includes the steps: (i) disposing a metal pattern layer on an adhesive carrier; (ii) placing at least one kind of electronic component on the adhesive carrier, the placed electronic component being not overlapped with respect to the metal pattern layer; (iii) forming a sealing resin layer on the adhesive carrier, and thereby producing a precursor of the electronic component package; (iv) peeling off the adhesive carrier of the precursor, whereby the metal pattern layer and an electrode of the electronic component are exposed at the surface of the sealing resin layer; and (v) forming a metal plating layer such that the metal plating layer is in contact with the exposed surface of the metal pattern layer and the exposed surface of the electrode of the electronic component.

17 Claims, 9 Drawing Sheets

(51) Int. Cl.
*H01L 33/50* (2010.01)
*H01L 23/00* (2006.01)
*H01L 23/495* (2006.01)
*H01L 21/48* (2006.01)
*H01L 21/56* (2006.01)

(52) U.S. Cl.
CPC .......... *H01L23/49541* (2013.01); *H01L 24/19* (2013.01); *H01L 24/83* (2013.01); *H01L 24/96* (2013.01); *H01L 33/486* (2013.01); *H01L 33/50* (2013.01); *H01L 21/561* (2013.01); *H01L 21/568* (2013.01); *H01L 24/73* (2013.01); *H01L 2224/04105* (2013.01); H01L 2224/16225 (2013.01); H01L 2224/16245 (2013.01); H01L 2224/32225 (2013.01); H01L 2224/32245 (2013.01); H01L 2224/48091 (2013.01); H01L 2224/48247 (2013.01); H01L 2224/73265 (2013.01); H01L 2224/838 (2013.01); H01L 2224/97 (2013.01); H01L 2924/12041 (2013.01); H01L 2924/12042 (2013.01); H01L 2924/1531 (2013.01); H01L 2924/15192 (2013.01); H01L 2924/19041 (2013.01); H01L 2924/19042 (2013.01); H01L 2924/19105 (2013.01)

(56) References Cited

U.S. PATENT DOCUMENTS

| | | | |
|---|---|---|---|
| 6,180,263 B1* | 1/2001 | Naoi | C23C 28/321 428/634 |
| 7,202,107 B2 | 4/2007 | Fuergut et al. | |
| 7,927,922 B2 | 4/2011 | Shen et al. | |
| 8,062,537 B2 | 11/2011 | Tuominen et al. | |
| 8,319,246 B2 | 11/2012 | Sugizaki | |
| 2001/0015242 A1* | 8/2001 | Yao | C22F 1/04 148/421 |
| 2003/0021889 A1* | 1/2003 | Wakizaka | H05K 3/381 427/537 |
| 2004/0137661 A1* | 7/2004 | Murayama | H01L 21/76898 438/106 |
| 2006/0183269 A1* | 8/2006 | Fuergut | H01L 21/568 438/106 |
| 2007/0015001 A1* | 1/2007 | Uno | C25D 5/34 428/655 |
| 2007/0261234 A1* | 11/2007 | Song | H05K 3/381 29/829 |
| 2007/0267136 A1 | 11/2007 | Tuominen et al. | |
| 2008/0090095 A1* | 4/2008 | Nagata | C23C 14/20 428/626 |
| 2009/0244868 A1 | 10/2009 | Morita et al. | |
| 2009/0314525 A1* | 12/2009 | Kajino | H05K 1/0265 174/255 |
| 2010/0139959 A1* | 6/2010 | Nagao | C23C 22/52 174/257 |
| 2010/0320928 A1* | 12/2010 | Kaihotsu | H01L 25/0753 315/250 |
| 2011/0073900 A1 | 3/2011 | Sugizaki | |
| 2011/0127070 A1* | 6/2011 | Ahn | H05K 3/107 174/250 |
| 2012/0057339 A1* | 3/2012 | Mitsuishi | C09K 11/0883 362/231 |
| 2012/0067611 A1* | 3/2012 | Kohda | H03H 9/1021 174/50.54 |
| 2012/0168206 A1 | 7/2012 | Sekine et al. | |
| 2012/0234584 A1* | 9/2012 | Ejiri | H05K 3/244 174/257 |
| 2012/0244352 A1* | 9/2012 | Hisano | B32B 15/08 428/355 N |
| 2012/0255166 A1* | 10/2012 | Kim | H05K 1/038 29/846 |
| 2013/0256884 A1* | 10/2013 | Meyer | H01L 24/94 257/738 |
| 2013/0295407 A1* | 11/2013 | Obata | C23C 2/02 428/607 |
| 2014/0347835 A1* | 11/2014 | Shimizu | H05K 1/0269 361/764 |

FOREIGN PATENT DOCUMENTS

| | | |
|---|---|---|
| JP | 2002-170921 | 6/2002 |
| JP | 2003-017757 | 1/2003 |
| JP | 2005-019754 | 1/2005 |
| JP | 2008-042041 | 2/2008 |
| JP | 2008-522396 | 6/2008 |
| JP | 2009-129928 | 6/2009 |
| JP | 2011-071274 | 4/2011 |
| JP | 2012-164956 | 8/2012 |
| WO | 2008/088165 | 7/2008 |

OTHER PUBLICATIONS

Japanese Office Action issued Jun. 3, 2014 in corresponding Japanese Patent Application No. 2014-512980.
International Preliminary Report on Patentability and Written Opinion of the International Searching Authority issued Mar. 12, 2015 in International (PCT) Application No. PCT/JP2013/004706.
International Preliminary Report on Patentability and Written Opinion of the International Searching Authority issued Mar. 19, 2015 in International (PCT) Application No. PCT/JP2013/004704.
International Search Report issued Oct. 8, 2013 in International (PCT) Application No. PCT/JP2013/004706 with English translation.
International Search Report issued Oct. 15, 2013 in International (PCT) Application No. PCT/JP2013/004704 with English translation.
Office Action issued Jan. 22, 2016 in related U.S. Appl. No. 14/402,221.

* cited by examiner

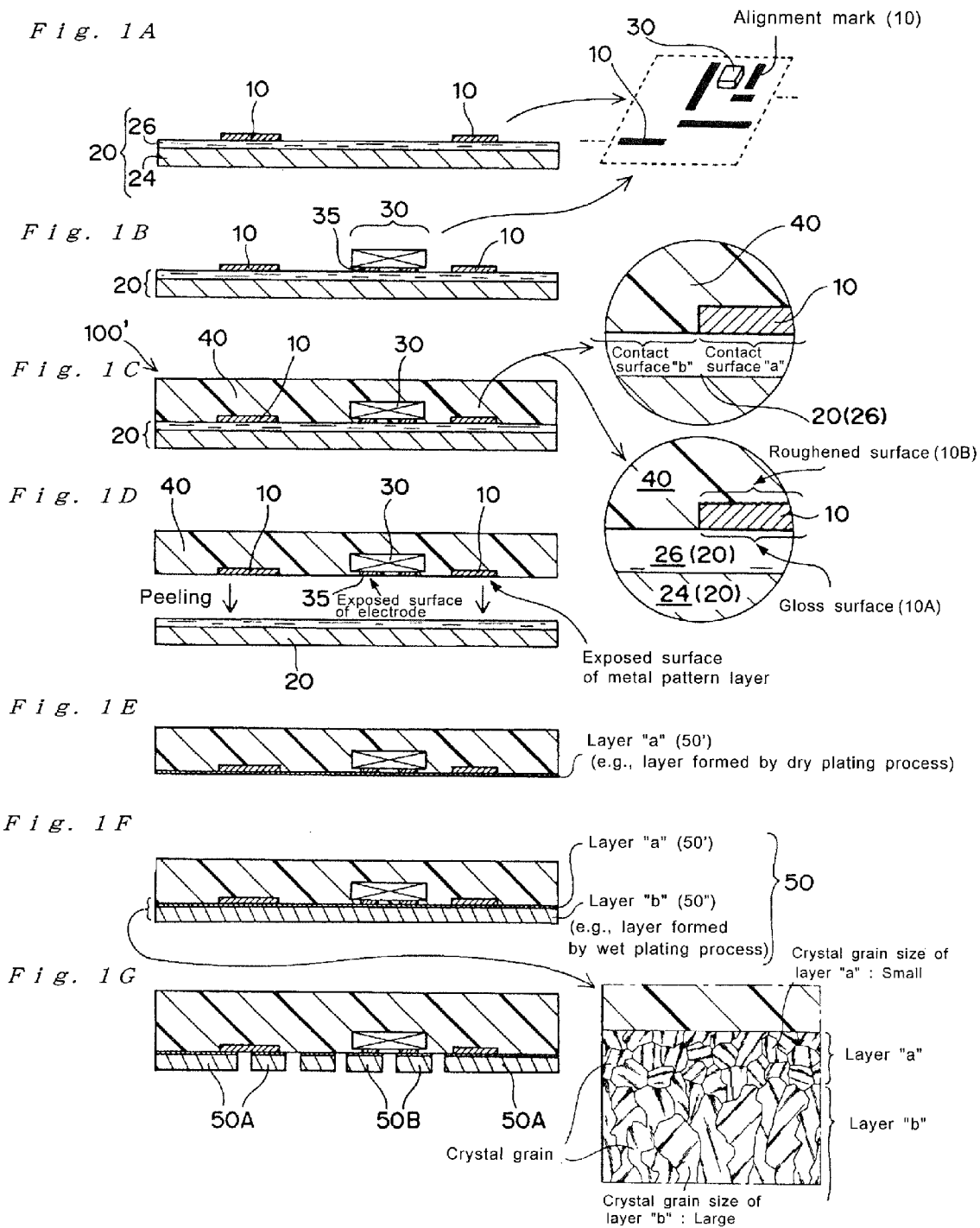

Dicing operation

Light-emitting element (30)   10

44

46
100'

30   10

50

50A   50B   50A 46  44
100
Light-emitting element (30)
Crystal grain
Crystal grain size of layer "a" : Small
Layer "a"
Layer "b"
Crystal grain size of layer "b" : Large Package with circuit substrate
(Wiring-bonding type / Flip-chip type)

Package with lead frame

ELECTRONIC COMPONENT PACKAGE AND METHOD OF MANUFACTURING SAME

TECHNICAL FIELD

The present disclosure relates to an electronic component package and a method for manufacturing the electronic component package. More particularly, the present disclosure relates to a package product equipped with an electronic component, and a method for manufacturing such package product.

BACKGROUND OF THE INVENTION

With the advance of electronic devices, various package technologies have been developed in the electronics field. For example, a packaging (i.e., packaging technique) using a circuit substrate or a lead frame has been developed for a mounting of electronic components such as IC and inductor. That is, there have been "package with circuit substrate" and "package with lead frame" as a general package form of the electronic component.

"Package with circuit substrate" (see FIG. 11A has such a form that the electronic component has been mounted on the substrate. This package generally has "Wire Bonding type (W/B type)" and "Flip Chip type (F/C type)". While on the other hand, "package with lead frame" (see FIG. 11B) has such a form that a lead frame, which may be composed of a lead or die pad, is included therein. In this lead frame-type package as well as the circuit substrate-type package, a bonding of the various electronic components is provided by a soldering or the like.

PATENT DOCUMENTS

Prior Art Patent Documents

PATENT DOCUMENT 1: U.S. Pat. No. 7,927,922
PATENT DOCUMENT 2: U.S. Pat. No. 7,202,107
PATENT DOCUMENT 3: JP2008-522396

DISCLOSURE OF THE INVENTION

Problems to be Solved by the Invention

Although "package with circuit substrate" makes it possible to provide a high-density packaging, there has been still problems of a heat releasing, the problem being attributed to the presence of the circuit substrate. The cost of the substrate in itself is not negligible, and thus "package with circuit substrate" is not necessarily satisfactory in terms of cost. Furthermore, the cost for a wire bonding or flip-chip mounting is also not negligible, and thus the cost reduction thereof is desired. In this regard, a costly mounter is generally required in the flip-chip mounting.

As for the lead frame-type package (see FIG. 11B), the lead frame in itself makes it difficult to provide a fine process. Thus, the lead frame-type package is not appropriate for the high-density packaging. The lead frame-type package as well as the circuit substrate-type package is associated with the soldering, which could raise a concern about so-called "solder flash" upon the whole sealing with resin material. Due to the solder flash, these packages are not necessarily satisfactory in terms of connection reliability. Specifically, there is such a concern that solder material used for the connection of package components can be re-melted due to the heating of the soldering for module packaging, and thus the re-melted solder material may seeps into the fine interstices (the seeping being referred to "flash"), or may adversely cause a short circuit.

Under the above circumstances, an embodiment of the present invention has been created. In other words, a main object of an embodiment of the present invention is to provide a packaging technology capable of satisfying desired heat releasing and connection reliability while achieving a low-cost mounting.

Means for Solving the Problem

Rather than addressing as merely extensions of conventional arts, the inventors tried to accomplish the above main object by addressing from a new point of view. As a result, the inventors have created the invention of an electronic component package and a manufacturing method thereof, both of which are capable of achieving the above main object. Specifically, an embodiment of the present invention provides a method for manufacturing an electronic component package, the method comprising the steps:

(i) disposing a metal pattern layer on an adhesive carrier such that the metal pattern layer is attached to the adhesive carrier;

(ii) placing at least one kind of electronic component on the adhesive carrier such that the electronic component is attached to the adhesive carrier, the placed electronic component being not overlapped with respect to the metal pattern layer on the adhesive carrier;

(iii) forming a sealing resin layer on the adhesive carrier such that the metal pattern layer and the electronic component are covered with the sealing resin layer, whereby a precursor of the electronic component package is produced;

(iv) peeling off the adhesive carrier of the precursor, whereby the metal pattern layer and an electrode of the electronic component are exposed at the surface of the sealing resin layer; and (v) forming a metal plating layer such that the metal plating layer is in contact with the exposed surface of the metal pattern layer and the exposed surface of the electrode of the electronic component, wherein, in the step (v), a layer "a" (which can be referred to a sub-plating layer "a") with a relatively small average crystal grain size is formed, and thereafter a layer "b" (which can be referred to a sub-plating layer "b") with a relatively large average crystal grain size is formed.

One of the features of the manufacturing method of the electronic component package according to an embodiment of the present invention is that the metal plating layer having a two-layered structure of different two layers with their average crystal grain sizes being different from each other is formed with respect to the exposed surface of the metal pattern layer and the exposed surface of the electrode of the electronic component. Another feature of the manufacturing method according to an embodiment of the present invention is that the metal pattern layer, which is locally inter-positioned between the sealing resin layer and the adhesive carrier, improves an overall detachability of the adhesive carrier with respect to the sealing resin layer.

Furthermore, an embodiment of the present invention also provides an electronic component package, comprising:

a sealing resin layer;

a metal pattern layer and at least one kind of electronic component, the metal pattern layer and the electronic component being buried in the sealing resin layer; and a metal plating pattern layer "A" and a metal plating pattern layer "B", the layer "A" being in contact with the metal pattern layer, the layer "B" being in contact with the electronic component, wherein the sealing resin layer includes the metal pattern layer and an electrode of the electronic component buried in the sealing resin layer such that the buried metal pattern layer and the buried electrode are flush with the sealing resin layer, wherein each of the metal plating pattern layers "A" and "B" has a two-layered structure of a layer "a" (i.e., sub-plating layer "a") with a relatively small average crystal grain size and a layer "b" (i.e., sub-plating layer "b") with a relatively large average crystal grain size, the layer "a" being located relatively inside, the layer "b" being located relatively outside.

One of the features of the electronic component package according to an embodiment of the present invention is that the metal plating pattern layers "A" and "B", which are in contact with the metal pattern layer and the electronic component buried in the sealing resin layer, respectively have the two-layered structure of different two layers with their average crystal grain sizes being different from each other (in which the layer "a" with a relatively small average crystal grain size is located relatively inside, and the layer "b" with a relatively large average crystal grain size is located relatively outside), and that the buried metal pattern layer and the buried electrode in the sealing resin layer are flush with such sealing resin layer.

Effect of the Invention

In accordance with an embodiment of the present invention, the desired heat releasing and connection reliability can be satisfied while achieving the low-cost mounting.

With respect to the "heat-releasing performance" according to an embodiment of the present invention, a mounting with no wire bonding or no bump is provided (that is, there is provided a wire bonding-less/bump-less package), which enables the heat from the electronic component to be released effectively via the metal plating layer and/or the metal pattern layer. In this regard, the metal plating layer can be made of a material with high thermal conductivity (e.g., copper material), and also can be provided as "metal plating layer having the large thickness". Therefore, an embodiment of the present invention makes it possible to effectively release the heat via the metal plating layer to the outside thereof.

An embodiment of the present invention can also achieve a packaging with no need of "soldering". As a result, the packaging with no soldering material included therein can be achieved. This makes it possible to avoid the unfavorable "solder flash", which leads to an improvement of the connection reliability.

Furthermore, the package according to an embodiment of the present invention has a "substrate-less structure". The substrate-less structure, i.e., no substrate of the package can contribute to a low-cost manufacturing of the package due to no cost of the substrate. As for such "substrate-less structure", it makes possible to achieve a more simplified packaging process, compared to the wire bonding or flip-chip mounting process, which can also contribute to the low cost manufacturing.

BRIEF DESCRIPTION OF THE DRAWINGS

FIGS. 1A to 1G are process-cross sectional views schematically illustrating a manufacturing method of an electronic component package according to an embodiment of the present invention.

DETAILED DESCRIPTION OF THE INVENTION

Figure 2A:
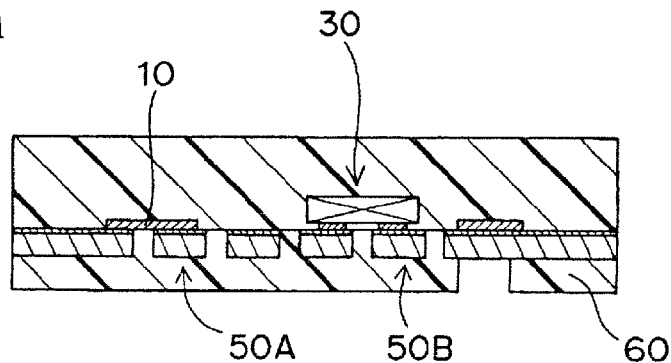
FIGS. 2A to 2C are process-cross sectional views schematically illustrating a manufacturing method of an electronic component package according to an embodiment of the present invention.

An electronic component package and a manufacturing method thereof will be hereinafter described in more detail. It should be noted that various parts or elements are schematically shown in the drawings wherein their dimensional proportions and their appearances are not necessarily real ones, and are merely illustrated for the purpose of making it easy to understand the present invention.

[Manufacturing Method of the Present Invention]

A method for manufacturing an electronic component package according to an embodiment of the present invention will be described. FIGS. 1A-1G and FIGS. 2A-2C schematically illustrate processes associated with the manufacturing method according to an embodiment of the present invention. In the manufacturing method according to an embodiment of the present invention, a step (i) is firstly carried out to dispose a metal pattern layer 10 on an adhesive carrier 20. More specifically, the metal pattern layer 10 is disposed on the adhesive carrier 20 such that the metal pattern layer 10 is attached to the adhesive carrier 20.

The adhesive carrier 20 is a carrier sheet composed of a base and an adhesive layer, for example. As shown in FIG. 1A, the carrier sheet having a two-layered structure in which the adhesive layer 26 is provided on a supporting base 24. In terms of a suitable peeling of the adhesive carrier (the peeling being later performed), it is preferred that the supporting base 24 is flexible.

The supporting base 24 of the carrier sheet may be any suitable sheet-like part as long as it cannot adversely affect "disposing/placing of metal patter layer and electronic component" or "formation of sealing resin layer", both of which will be later performed. For example, the material for the supporting base 24 may be a resin, a metal and/or a ceramic.

Examples of the resin may include polyester resin (e.g., polyethylene terephthalate, polyethylene naphthalate), acrylic resin (e.g., polymethylmethacrylate), polycycloolefin and polycarbonate. Examples of the metal for the supporting base 24 may include iron, copper, aluminium and alloy thereof. By way of example, the metal may be a stainless material (e.g., SUS). Examples of the ceramic for the supporting base 24 may include apatite, alumina, silica, silicon carbide, silicon nitride, and boron carbide. The thickness of the supporting base is preferably in the range of 0.1 mm to 2.0 mm, more preferably in the range of 0.2 mm to 1.0 mm (for example, 0.2 mm), because of its "sheet-like" form.

While on the other hand, the adhesive layer 26 may be any suitable one as long as it has an adhesive property with respect to the metal pattern layer and the electronic component. For example, the adhesive layer may comprise at least one kind of adhesive material selected from the group consisting of acrylic resin-based adhesive, urethane resin-based adhesive, silicone resin-based adhesive and epoxy resin adhesive. The thickness of the adhesive layer 26 is preferably in the range of 2 µm to 50 µm, more preferably in the range of 5 µm to 20 µm (for example, 10 µm). As the adhesive layer 26, a double-faced adhesive tape may be used. In this regard, the double faced tape wherein an adhesive layer is provided on both principal surfaces of a resin film layer (e.g., PET film) may be used, for example.

The metal pattern layer 10 disposed with respect to the adhesive carrier 20 is a patterned metal layer which has undergone a patterning treatment. The material of the metal pattern layer 10 may be a metal material selected from the group consisting of copper (Cu), aluminum (Al), silver (Ag), palladium (Pd), platinum (Pt) and nickel (Ni). The thickness of the metal pattern layer is preferably in the range of 5 µm to 100 µm, more preferably in the range of 10 µm to 50 µm (for example, 18 µm).

The patterning associated with the metal pattern layer 10 may be performed at a point in time before the placing of the layer 10 on the adhesive carrier 10. Alternatively, the patterning of the layer 10 may be performed at a point in time after the placing of the layer 10 on the adhesive carrier 10. In other words, the metal pattern layer 10 on the adhesive carrier 20 can be provided according to the following (1) or (2):

(1) A patterned metal foil, which has been preliminarily patterned, is attached to the adhesive carrier to provide the metal pattern layer on the adhesive carrier; and
(2) A metal foil or a metal layer is attached to the adhesive, followed by being subjected to a patterning treatment of the metal foil or the metal layer to provide the metal pattern layer on the adhesive carrier.

The patterning in itself is not particularly limited as long as it is used in the electronics packaging field. For example, a photolithography process can be performed for the patterning, in which case a formation of resist layer, an exposure to the light and subsequent development, and an etching are sequentially performed. As for the above (1), mechanical machining process such as a punching process may be performed to provide the patterned metal foil.

Subsequent to the step (i), the step (ii) is carried. Namely, as shown in FIG. 1B, at least one kind of electronic component 30 is placed at such a region of the carrier that the placed component 30 is not overlapped with respect to the metal pattern layer 10. As such, the electronic component 30 is attached to the adhesive carrier 20 such that the placed component 30 and the metal pattern layer 10 are not overlapped with respect to each other on the adhesive carrier 20. The electronic component 30 may be any suitable one as long as it is a circuit component/element used in the electronics packaging field. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, chip thermistor and a chip laminate filter, a connection terminal and the like.

It is preferred that the electronic component 30 is placed such that an electrode 35 of the electronic component 30 is in contact with the adhesive carrier 20. This enables the electrode 35 of the electronic component 30 to be suitably exposed upon the peeling of the adhesive carrier.

As for the placement of the electronic component 30, the metal pattern layer 10 can be used as a cognition pattern. Namely, at least a part of the metal pattern layer 10 can be used as an alignment mark (see upper-right illustration in FIG. 1A). For example, the alignment mark, i.e., the metal pattern layer 10 is used for positioning the electronic component 30 upon the placing of such component 30. This makes it possible to precisely position the electronic component 30, which leads to an achievement of high reliability of the package.

The alignment mark in itself may be included in a pattern of the metal pattern layer 10 to serve for the exclusive purpose of the positioning of the electronic component. Alternatively, the pattern of the metal pattern layer, which serves for another purpose, may be used as the alignment mark. An embodiment of the present invention is not limited to the alignment mark serving for the positioning of the electronic component. The alignment mark can also be used for the positioning of other components/parts.

Figure 10:
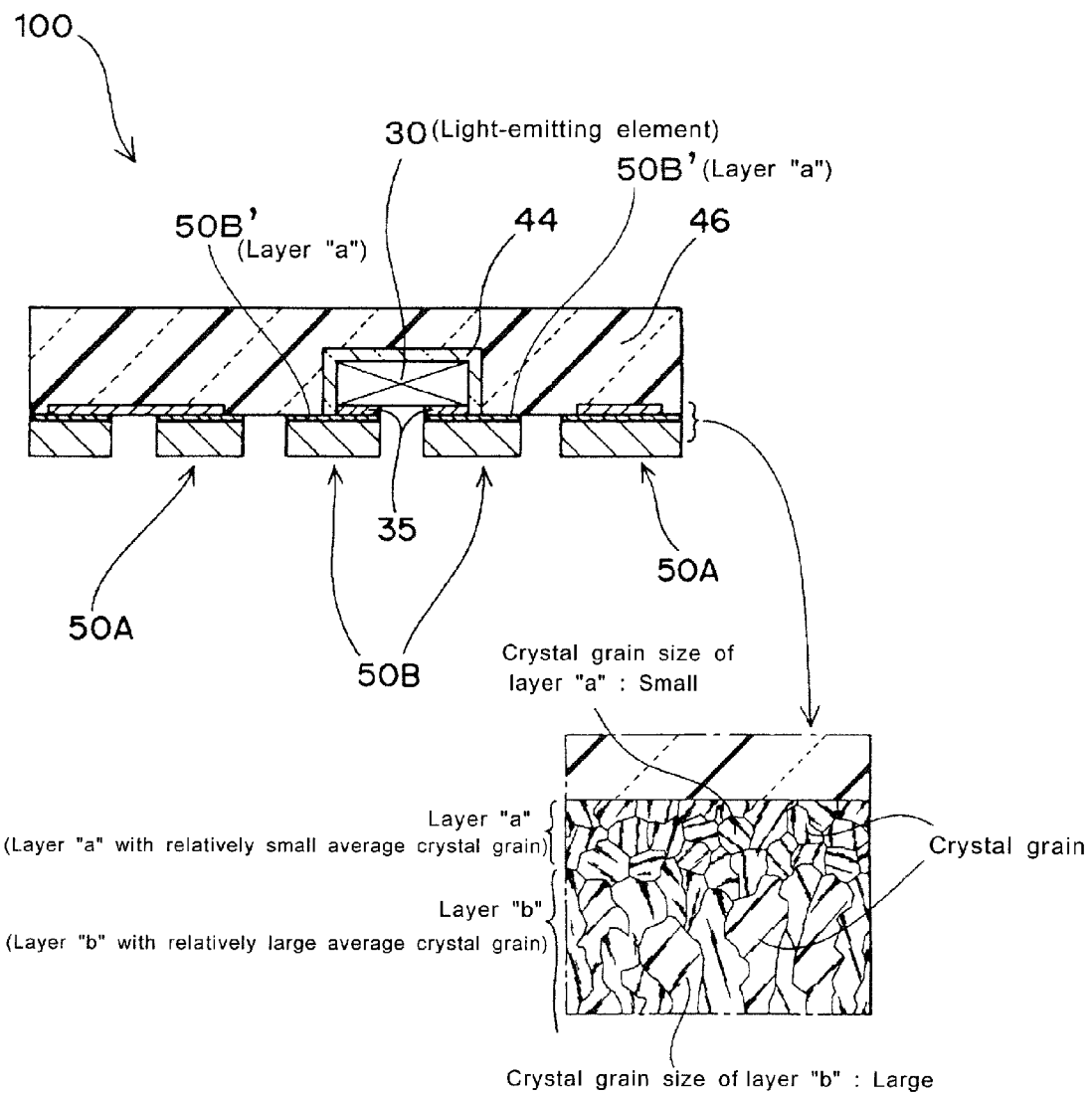
FIG. 10 is a cross-sectional view schematically illustrating a configuration of a light-emitting element package according to an embodiment of the present invention.
Figure 11A:
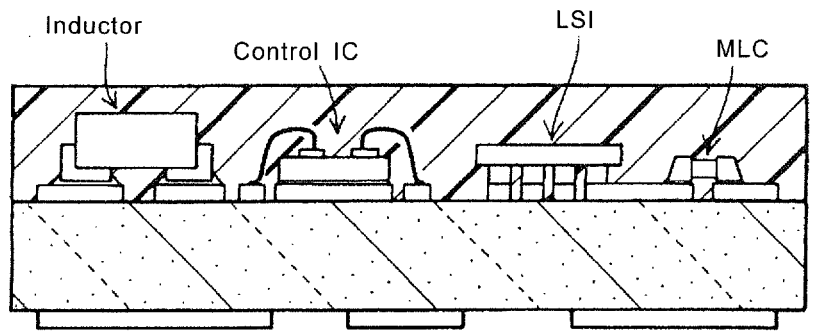
FIGS. 11A and 11B are cross-sectional views schematically illustrating a configurations of an electronic component package of the prior art.
Figure 11B:
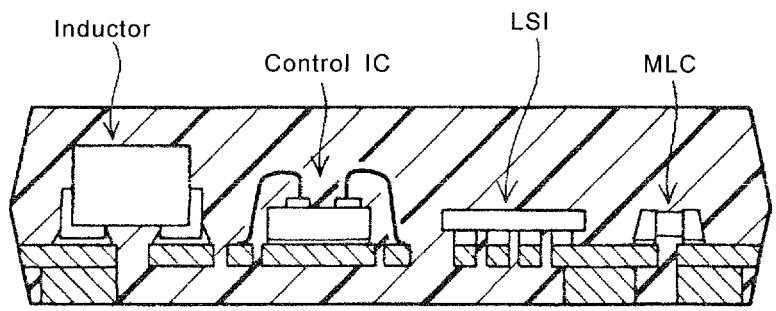

Subsequent to the step (ii), the step (iii) is carried. Namely, as shown in FIG. 10, a sealing resin layer 40 is formed on the adhesive carrier 20 such that the metal pattern layer 10 and the electronic component 30 are covered with the sealing resin layer 40, and thereby a precursor 100' of the electronic component package is produced. The formation of the sealing resin layer 40 can be performed by applying a resin material onto an adhesive surface of the adhesive carrier 20 by a spin-coating process or a doctor-blade process, followed by being subjected to a heat treatment or a light-exposure treatment. In other words, the sealing resin layer 40 can be provided by subjecting the applied resin material to a heat or light curing treatment. Alternatively, the sealing resin layer 40 may be provided by putting a resin film on the adhesive surface of the adhesive carrier 20. Furthermore, the sealing resin layer 40 may be provided by filling an uncured powdered or liquid resin into a die, followed by a heat curing thereof.

The material for the sealing resin layer 40 may be any suitable one as long as it exhibits an electrical insulation properties. For example, the material of the sealing resin layer may be an epoxy-based resin or a silicone-based resin. The thickness of the sealing resin layer 40 is preferably in the approximate range of 0.5 mm to 5.0 mm, and more preferably in the approximate range of 1.2 mm to 1.8 mm.

Subsequent to the step (iii), the step (iv) is carried. Namely, as shown in FIG. 1D, the adhesive carrier 20 is peeled off the precursor 100', and thereby the metal pattern layer 10 and an electrode 35 of the electronic component 30 are exposed at the surface of the sealing resin layer 40.

An embodiment of the present invention makes it possible to provide a suitable detachability of the adhesive carrier 20 by the presence of the metal pattern layer 10. More specifically, the presence of the metal pattern layer 10 improves an overall detachability of the adhesive carrier 20 with respect to the sealing resin layer 40, the metal pattern layer 10 being positioned locally at the interface between the sealing resin layer 40 and the adhesive carrier 20. This is due to the fact that a contact surface "a" between the metal pattern layer 10 and the adhesive carrier 20 exhibit a more reduced bonding property therebetween that of a contact surface "b" between the sealing resin layer 40 and the adhesive carrier 20 (see upper-right illustration in FIG. 10). In other words, the local presence of the contact surface "a" capable of exhibiting the reduced bonding property at the interface between the metal pattern layer 10 and the adhesive carrier 20 improves the detachability of the adhesive carrier 20 with respect to the sealing resin layer 40 as a whole. This means that the metal pattern layer 10, which is positioned locally at the interface between the sealing resin layer 40 and the adhesive carrier 20, serves as "peel-promoting part" or "peel-facilitating part" (i.e., part for promoting the peeling of the adhesive carrier).

As such, the effectively improved detachability between the adhesive carrier 20 and the sealing resin layer 40, which is due to the presence of the metal pattern layer, enables the peeling operation of the adhesive carrier 20 to be suitably performed.

It is preferred that the metal pattern layer having a gloss surface is used in order to more suitably perform the peeling of the adhesive carrier. More specifically, it is preferred that the gloss surface 10A of the metal pattern layer 10 is in a contact with the adhesive carrier 20 at a point in time before the peeling of the adhesive carrier 20 (see lower-right illustration in FIG. 10). In the step (i), the metal pattern layer 10 is preferably disposed on the adhesive carrier 20 such that the gloss surface 10A of the metal pattern layer 10 makes contact with the adhesive carrier 20 (especially the adhesive layer 26). The gloss surface of the metal pattern layer 10 is capable of further reducing the bonding property of the contact surface "a" between the metal pattern layer 10 and the adhesive carrier 20, which leads to the more improved detachability of the adhesive carrier 20 with respect to the sealing resin layer 40.

In addition to or instead of "gloss surface", the metal layer 10 preferably has a roughened surface. In this regard, it is preferred that the metal pattern layer 10 is covered with the sealing resin layer 40 such that the roughened surface 10B of the metal pattern layer 10 is in contact with the sealing resin layer 40 (see lower-right illustration in FIG. 10). This makes it possible to achieve a more suitable detachability of the adhesive carrier 20. It is preferred in the step (i) that the metal pattern layer 10 is disposed on the adhesive carrier 20 such that the roughened surface 10B of the metal pattern layer 10 is an exposed surface (namely, the opposed principal surface of the metal pattern layer is in contact with the adhesive carrier, such surface being opposed to the roughened surface). In the step (iii), the sealing resin layer 40 is provided with respect to such exposed roughened surface 10B, and thereby the metal pattern layer 10 is covered with the sealing resin layer 40 such that the roughened surface 10B and the sealing resin layer 40 are in contact with each other. The presence of "roughened surface" of the metal pattern layer can increase a bonding between the metal pattern layer 10 and the sealing resin layer 40, due to the fact that the roughened surface 10B is in a dig state into the sealing resin layer 40. As such, the roughened surface of the metal pattern layer makes it possible to achieve a more suitable detachability of the adhesive carrier 20.

In a particularly preferred embodiment, the metal pattern layer has both of "gloss surface" and "roughened surface". In the case where the metal pattern layer 10 has the gloss surface 10A and the roughened surface 10B, it is preferred that the metal pattern layer 10 is covered with the sealing resin layer 40 such that the gloss surface 10A of the metal pattern layer is in contact with the adhesive carrier 20, and the roughened surface 10B of the metal pattern layer and the sealing resin layer 40 are in bonding state with each other. This makes it possible to achieve both of "improved adhesion between the metal pattern layer 10 and the sealing resin layer 40" and "improved detachability between the sealing resin layer 40 and the adhesive carrier 20".

Figure 3:
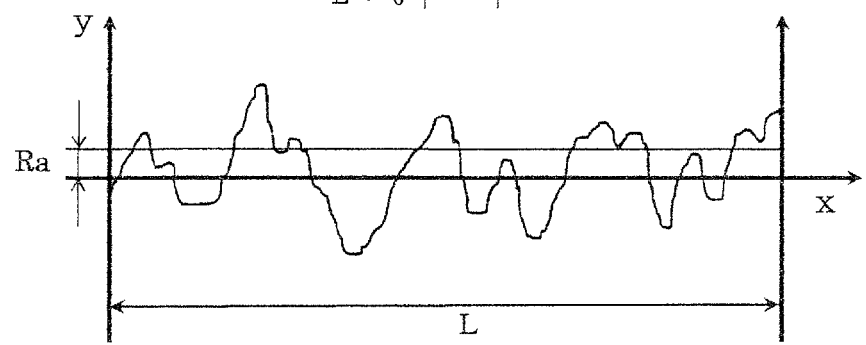
FIG. 3 is a representation of an arithmetic mean roughness "Ra".

The term "roughened surface" as used herein means that a principal surface of the metal pattern layer has a rough surface (i.e., fine concave-convex surface). For example, the term "roughened surface" substantially means that an arithmetic mean roughness Rz of the surface of the metal pattern layer 10 is 5.0 μm or higher, preferably 7.0 μm or higher. The upper limit for the arithmetic mean roughness Rz is not particularly limited, but may be about 10.0 μm or lower. While on the other hand, the term "gloss surface" as used herein means that a principal surface of the metal pattern layer has a smooth surface. For example, the "gloss surface" substantially means that an arithmetic mean roughness Ra of the surface of the metal pattern layer 10 is 0.3 μm or lower, preferably 0.2 μm or lower (as for Rz, Rz is 2.0 μm or lower, preferably 1.0 μm or lower). In other words, the gloss surface of the metal pattern layer has the arithmetic mean roughness Ra of 0 (excluding 0) to 0.3 μm, preferably 0 (excluding 0) to 0.2 μm. The term "arithmetic mean roughness Ra" as used herein substantially means a mean value calculated from the sum of absolute values of the deviations from the average line over the length L of an evaluation section that is set in the roughness curve as shown in FIG. 3 ("roughness curve" in this case corresponds to a section profile of the surface of the metal pattern layer). While on the other hand, the term "arithmetic mean roughness Rz" for the surface of the metal pattern layer substantially is roughness "Rz" defined in JIS B0601. More specifically, the term "arithmetic mean roughness Rz" as used herein means the sum value (μm) of the average of absolute values from the uppermost mountain peak (Yp) to the fifth mountain peak (Yp) and the average of absolute values from the lowermost valley portion (Yv) to the fifth valley portion (Yv), the mountain peak and the valley portion being measured perpendicularly from the average line over the length of an evaluation section that is set in the roughness curve. See JIS B0601:1994.

Subsequent to the step (iv), the step (v) is carried. Namely, a metal plating layer is formed such that the metal plating layer is in contact with the exposed surface of the metal pattern layer, the exposed surface of the sealing resin layer, and the exposed surface of the electrode of the electronic component. In the step (v), a layer "a" having a relatively small average size of its crystal grain is formed (see FIG. 1E), and thereafter a layer "b" having a relatively large average size of its crystal grain is formed (see FIG. 1F) to provide the metal plating layer 50. For example, the metal plating layer 50 may be formed such that the average crystal grain size of the layer "a" is 2 μm or lower, and the average crystal grain size of the layer "b" is 5 μm or higher. More specifically, the average crystal grain size of the layer "a" may be in the range of 0 (excluding 0) to 2 μm, and the average crystal grain size of the layer "b" may be in the range of 5 μm to 20 μm. Such layers "a" and "b" can be formed by suitably utilizing various plating processes. For example, the layer "a" with the relatively small average crystal grain size and the layer "b" with the relatively large average crystal grain size can be formed by a dry plating process, followed by a wet plating process. In other words, the foundation layer "a" with the relatively small average crystal grain size is formed by performing the dry plating process, and thereafter the thick layer "b" with the relatively large average crystal grain size by performing the wet plating process (see lowermost-right illustration in FIG.

1). Examples of the dry plating process include a vacuum plating process (Physical Vapor Deposition, i.e., PVD process) and a chemical vapor plating process (Chemical Vapor Deposition, i.e., CVD process). Examples of the vacuum plating process include a sputtering process, a vacuum deposition process, and an ion plating process. On the other hand, examples of the wet plating process include an electroplating process (e.g., electrolytic plating process), a chemical plating process, and a hot-dip plating process.

In a preferred embodiment of the manufacturing method of the present invention, the sputtering may be performed as the dry plating process, whereas the electroplating (e.g., electrolytic plating) may be performed as the wet plating process. In the step (v) wherein these plating processes are performed, the foundation layer "a" with the average crystal grain size smaller than that of the layer "b" may be formed by the dry plating process (e.g., sputtering process), and whereas the thick layer "b" with the average crystal grain size larger than that of the layer "a" may be formed by the wet plating process (e.g., the electroplating plating process such as electrolytic plating process). The term "crystal grain size" as used herein means that a grain size calculated based on the cross-sectional image taken along the thickness direction of the metal plating layer, as shown in lowermost-right illustration in FIGS. 1A-1G. For example, the term "crystal grain size" means that a diameter of the circle having the same area as that of the crystal grain obtained from its cross-sectional image, and particularly the diameter calculated as a number average by measuring each grain diameter of 50 grains for example.

The manufacturing method of the present invention according to an embodiment of the present invention, which utilizes the dry and wet plating processes, has such a process feature that a metal layer is directly provided with respect to the exposed surface of the metal pattern layer and the exposed surface of the electrode of the electronic component. The layer "a" serving as the foundation layer for the thick layer "b" can be provided in a very thin form, and thus it can be regarded that the thick layer "b" is in direct contact with the exposed surface of the metal pattern layer and the exposed surface of the electrode of the electronic component. Due to large thickness of the thick layer "b", the metal plating layer 50 can be used as a heat-releasing part of the electronic component package. Particularly when focusing on the manufacturing processes, due to the dry plating process, the plating layer "b" with being thick and having good adhesion can be formed by the subsequent wet plating process.

It is preferred that the dry plating layer "a" 50' with its thickness of 100 nm to 3000 nm is formed by the dry plating process (see FIG. 1E), and thereafter the wet plating layer "b" 50" with its thickness of 18 μm to 500 μm is formed on the layer "a" by the wet plating process (see FIG. 1F). Namely, the dry plating layer 50' (i.e., layer "a") is provided in the very thin form, whereas the wet plating layer 50" (i.e., layer "b") is provided in the thick form, which leads to a large thickness of the metal plating layer 50 as a whole.

The dry plating layer 50' formed by the dry plating process preferably comprises at least one kind of metal material selected from the group consisting of Ti (titanium), Cr (chromium), Ni (nickel) and the like. While on the other hand, the wet plating layer 50" formed by the wet plating process preferably comprises at least one kind of metal material selected from the group consisting of Cu (copper), Ni (nickel) and Al (aluminum).

By way of example, the layer "a" 50' is not limited to a single layer but may be formed as a form of multiple layers. For example, a Ti thin film layer and a Cu thin film layer may be formed as the dry plating layer "a" 50' by the sputtering process. More specifically, the formation of the Ti thin film layer is performed, followed by the formation of the Cu thin film layer, the both formations being performed by the sputtering process. On such sputtering layers having the two-layers structure, it is preferable to form the thick plating copper layer "b" 50" by the electrolytic plating process.

Preferably, the metal plating layer 50 is subjected to a patterning treatment. It is preferred that the metal plating layer 50 having the two-layered structure of a layer "a" with the relatively small average crystal grain size and a layer "b" with the relatively large average crystal grain size is subjected to the patterning treatment. Specifically, as shown in FIG. 1G, the patterning treatment of the metal plating layer 50 is preferably performed to form the metal plating pattern layers "A" 50A and "B" 50B therefrom, the metal plating pattern layer "A" 50A being in contact with the exposed surface of the metal pattern layer 10, the metal plating pattern layer "B" 50B being in contact with the exposed surface of the electrode of the electronic component. The patterning treatment leads to a desired wiring formation, e.g., a desired pattern formation of wirings including an extraction electrode. The patterning in itself is not particularly limited as long as it is used in the electronics packaging field. For example, a photolithography process can be available for the patterning, in which case a formation of resist layer, an exposure to the light and subsequent development, and an etching are sequentially performed. In addition to the formation of the metal plating pattern layer "A" 50A in contact with the exposed surface of the metal pattern layer 10, and the metal plating pattern layer "B" 50B in contact with the exposed surface of the electrode of the electronic component, further metal plating pattern layer may be formed, the further layer being in no contact with both of "metal pattern layer 10" and "exposed surface of the electrode of the electronic component". The further metal plating pattern layer enables the heat to be directly released therethrough, in addition to or instead of through the surfaces of the sealing resin and electrode of the electronic component.

Subsequent to the patterning treatment of the metal plating layer, a resist layer is preferably formed with respect to the metal plating pattern layer. For example, it is preferred as shown in FIG. 2A that a solder resist layer 60 is formed on the surface of the sealing resin layer (the surface being an exposed surface due to the peeling of the adhesive carrier) such that the metal plating pattern layers "A" 50A and "B" 50B are partially covered with the resist layer. The formation of the resist layer 60 may be the same as that generally used in the electronics packaging field.

Figure 2B:
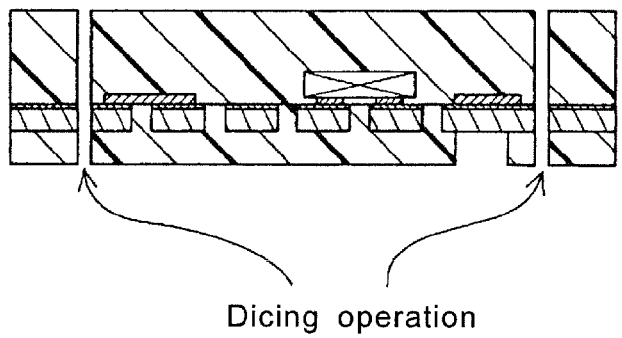
Figure 2C:
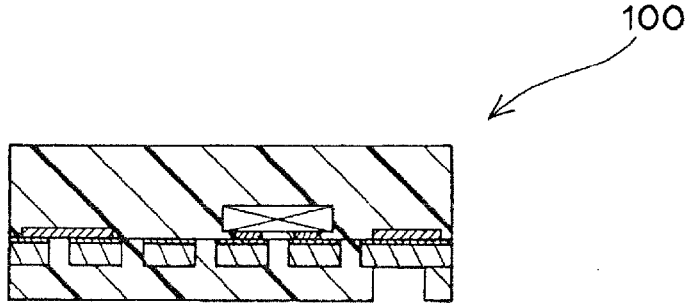

Through the above steps (with an additional step of the dicing operation as shown in FIG. 2B, for example), there can be finally obtained an electronic component package 100 as shown in FIG. 2C.

The manufacturing method of the present invention can be performed in various process embodiments, which will be now described below.

(Concurrent Manufacturing of Plural Electronic Component Packages)

Figure 4:
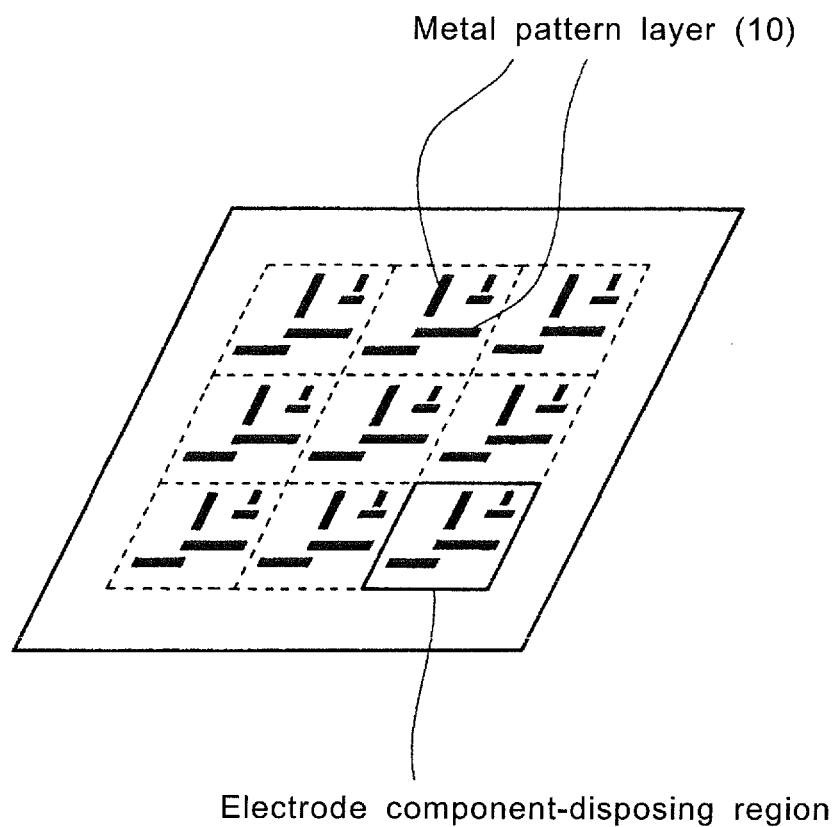
FIG. 4 is a schematic view for a metal pattern layer with a plurality of electronic component-disposing regions included therein.
Figure 5A:
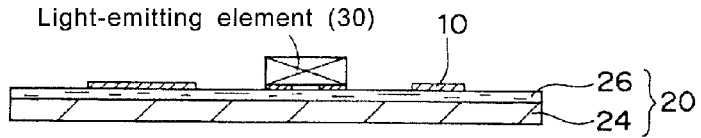
FIGS. 5A to 5H are process-cross sectional views schematically illustrating a manufacturing method of a light-emitting element package according to an embodiment of the present invention.
Figure 5B:
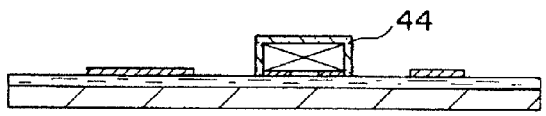
Figure 5C:
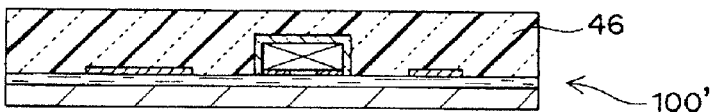
Figure 5D:
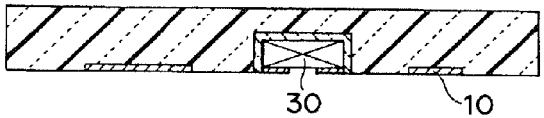
Figure 5E:
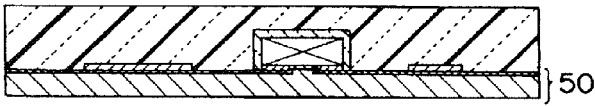
Figure 5F:
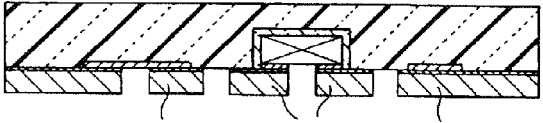
Figure 5G:
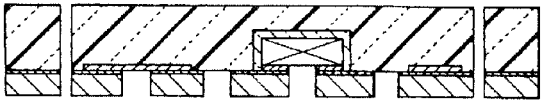
Figure 5H:
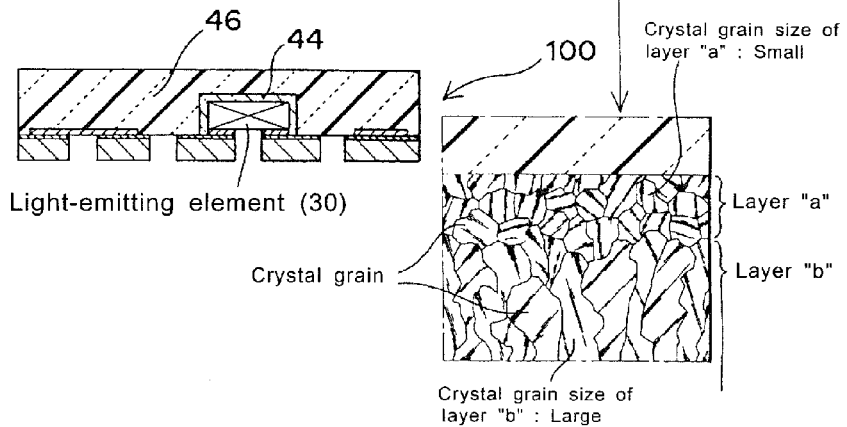

According to an embodiment of the method of the present invention, a plurality of the electronic component packages can be manufactured concurrently. It is preferred in this regard that "metal pattern layer with a form of a plurality of openings included therein" is used as the metal pattern layer. Specifically, as the metal pattern layer disposed on the adhesive carrier in the step (i), a metal pattern layer with a plurality of electronic component-disposing regions included therein is used (see FIG. 4). The metal pattern layer with the plurality of electronic component-disposing regions included therein may be a metal pattern layer having a plurality of spaces for the electronic components, the spaces being in an array form. In the step (ii), the electronic components to be used for respective ones of the electronic component packages are placed in the respective ones of the electronic component-disposing regions of metal pattern layer. Namely, each of the electronic components is placed on each of the respective ones of the electronic component-disposing regions, i.e., respective ones of local exposed regions of the adhesive carrier. This makes it possible to produce a precursor of the electronic component packages (in which a plurality of package precursors are integrated with each other) at a time. At a point in time after the step (v), a dicing operation may be performed to divide the electronic component-disposing regions of the metal pattern layer into respectively-separated regions, which results in a production of the plurality of electronic component packages.

(Manufacturing of Light-Emitting Package)

An embodiment of the method of the present invention also makes it possible to suitably manufacture a light-emitting element package when the light-emitting element is provided as the electronic component (i.e., when the light-emitting element is included as the electronic component to be placed on the adhesive carrier in the step (ii)). In the manufacturing of the light-emitting element package, the formations of a fluorescent layer and a transparent resin layer are performed instead of the formation of the sealing resin layer in the step (ii). Specifically, the fluorescent layer 44 is formed on the light-emitting element disposed on the adhesive layer, and thereafter the transparent resin layer 46 is formed to cover the light-emitting element and the fluorescent layer (see FIGS. 5A to 5H). As a result, there can be obtained a desired light-emitting element package. The formations of the fluorescent layer and the transparent resin layer may be similar to those generally used in a conventional LED package manufacturing.

[Electronic Component Package of the Present Invention]

An electronic component package according to an embodiment of the present invention will now be described. The electronic component package is a package obtained by the above mentioned manufacturing method according to an embodiment of the present invention.

Figure 6:
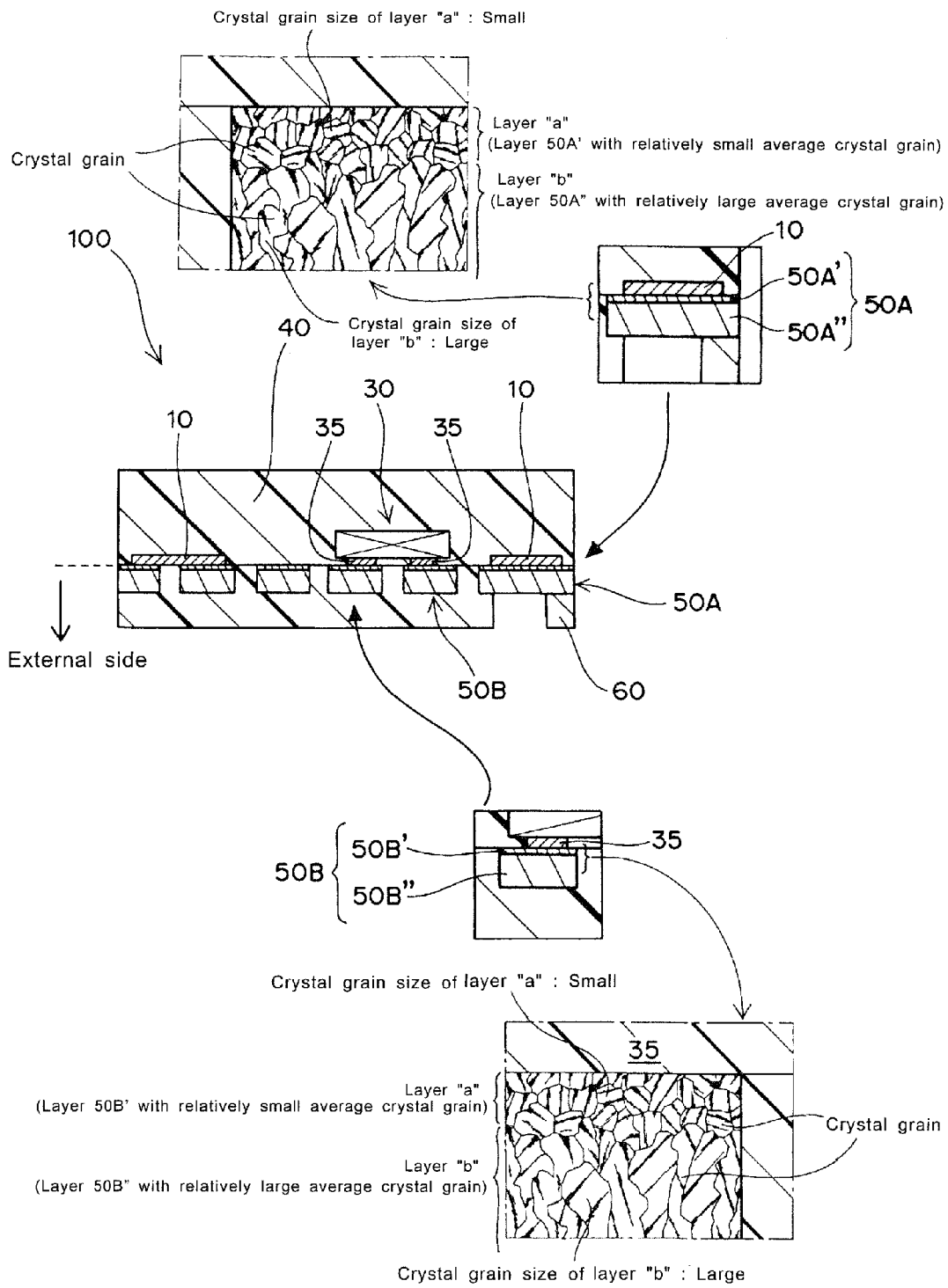
FIG. 6 is a cross-sectional view schematically illustrating a configuration of an electronic component package.

FIG. 6 illustrates a configuration of the electronic component package according to an embodiment of the present invention. As shown in FIG. 6, the electronic component package 100 comprises the sealing resin layer 40, the metal pattern layer 10, the electronic component 30, the metal plating pattern layer "A" 50A, and the metal plating pattern layer "B" 50B, the layer "A" being in contact with the metal pattern layer, the layer "B" being in contact with the electronic component.

As shown in FIG. 6, the metal pattern layer 10 and the electronic component 30 are in an embedded state in the sealing resin layer 40. In the package according to an embodiment of the present invention, the sealing resin layer 40 has the metal pattern layer 10 and the electronic component 30, both of which are in the embedded state in the resin layer such that the metal pattern layer 10 and the electronic component 30 are flush with the sealing resin layer 40. Namely, the surface of the metal pattern layer 10 and the surface of the sealing resin layer 40 are on substantially the same plane, and also the surface of the electronic component 30 and the surface of the sealing resin layer 40 are on substantially the same plane. As for the electronic component 30, it is preferred that the electrode 35 of the electronic component is flush with the sealing resin layer 40. This means that the surface of the electrode 35 of the electronic component and the surface of the sealing resin layer 40 are preferably on substantially the same plane.

In the package according to an embodiment of the present invention, each of the metal plating pattern layers "A" 50A and "B" 50B has a two-layered structure of a layer "a" with a relatively small average crystal grain size and a layer "b" with a relatively large average crystal grain size, as shown in FIG. 6. In the two-layered structure, the layer "a" is located relatively inside, whereas the layer "b" is located relatively outside. As for the metal plating pattern layers "A" 50A, the layer "a" 50A' is provided such that it is in direct contact with the metal pattern layer 10, and the layer "b" 50A" is provided on the layer "a" (see upper-right enlarged illustration in FIG. 6). Similarly, in the metal plating pattern layers "B" 50B, the layer "a" 50B' is provided such that it is in direct contact with the electronic component (especially the electrode 35 thereof), and the layer "b" 50B" is provided on the layer "a" (see lower-right enlarged illustration in FIG. 6). As such, the phrase " . . . located relatively outside" as used herein substantially means that the layer is located distally with respect to the exposed surface of the metal pattern layer/the exposed surface of the electrode of the electronic component, and whereas the phrase " . . . located relatively inside" as used herein substantially means that the layer is located proximally with respect to the exposed surface of the metal pattern layer/ the exposed surface of the electrode of the electronic component.

As for the specific crystal grain sizes of the layers "a" and "b" in the electronic component package according to an embodiment of the present invention, each of the metal plating pattern layers "A" 50A and "B" 50B has the two-layered structure of the layer "a" with the average crystal grain size of 2 μm or lower and the layer "b" with the average crystal grain size of 5 μm or higher. More specifically, the average crystal grain size of the layer "a" is in the range of 0 (excluding 0) to 2 μm, whereas the average crystal grain size of the layer "b" is in the range of 5 μm to 20 μm.

In a case where the layers "a" and "b" are provided respectively by the dry and wet plating processes, the layer "a" is the dry plating layer and the layer "b" is the wet plating layer. In this regard, each of the metal plating pattern layers "A" 50A and "B" 50B has the two-layered structure of the wet plating layer (50A", 50B") located relatively outside, and the dry plating layer (50A', 50B') located relatively inside. As for the metal plating pattern layers "A" 50A, the dry plating layer 50A' is provided such that it is in direct contact with the metal pattern layer 10, and the wet plating layer 50A" is provided on the dry plating layer (see upper-right enlarged illustration in FIG. 6). Similarly, in the metal plating pattern layers "B" 503, the dry plating layer 50B' is provided such that it is in direct contact with the electronic component (especially the electrode 35 thereof), and the wet plating layer 50B" is provided on the dry plating layer (see lower enlarged illustration in FIG. 6).

The metal pattern layer embedded in the sealing resin layer comprises a metal material selected from the group consisting of copper (Cu), aluminum (Al), silver (Ag), palladium (Pd), platinum (Pt) and nickel (Ni), for example. The thickness of the metal pattern layer is preferably in the range of 5 μm to 100 μm, more preferably in the range of 10 μm to 50 μm (for example, 18 μm).

Figure 7:
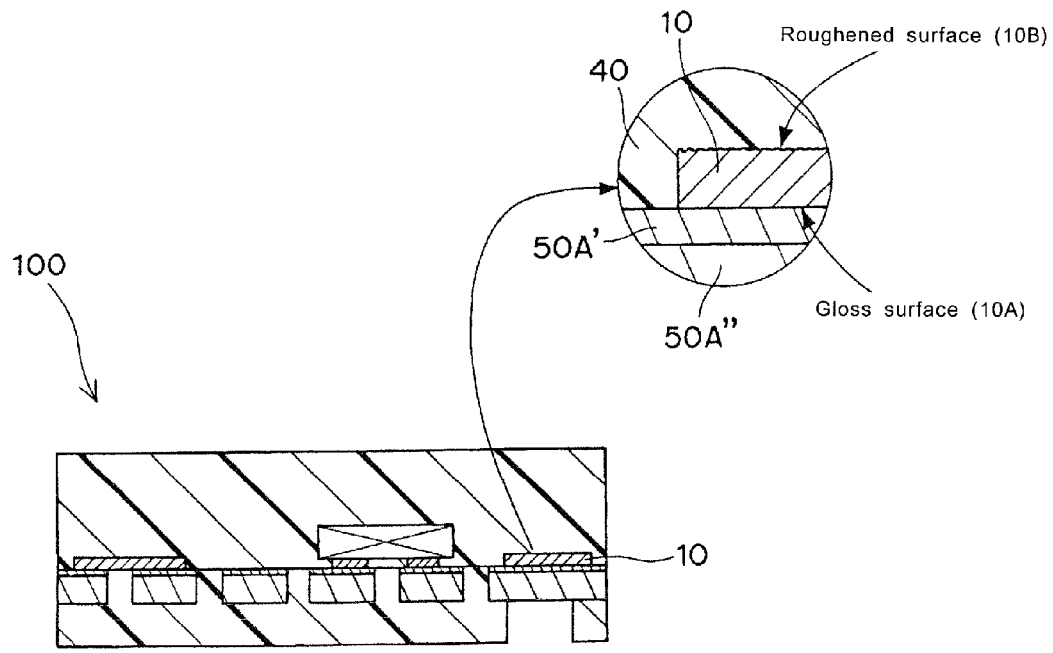
FIG. 7 is a cross-sectional view schematically illustrating a configuration of an electronic component package wherein a metal pattern layer has a gloss surface and a roughened surface.

In a case where the metal pattern layer 10 has the gloss surface, it is preferred that the metal pattern layer 10 is in the embedded state in the sealing resin layer 40 such that the gloss surface 10A is flush with the surface of the sealing resin layer 40 (see FIG. 7). In a case where the metal pattern layer 10 has the roughened surface 10B, it is preferred that the metal pattern layer 10 is covered with the sealing resin layer 40 such that the roughened surface 10B is in contact with the sealing resin layer 40 (see FIG. 7). As described above, the term "gloss surface" substantially means that an arithmetic mean roughness Ra of the surface of the metal pattern layer is 0.3 µm or lower, preferably 0.2 µm or lower, whereas the term "roughened surface" substantially means that an arithmetic mean roughness Rz of the surface of the metal pattern layer is 5.0 µm or higher, preferably 7.0 µm or higher.

Figure 8:
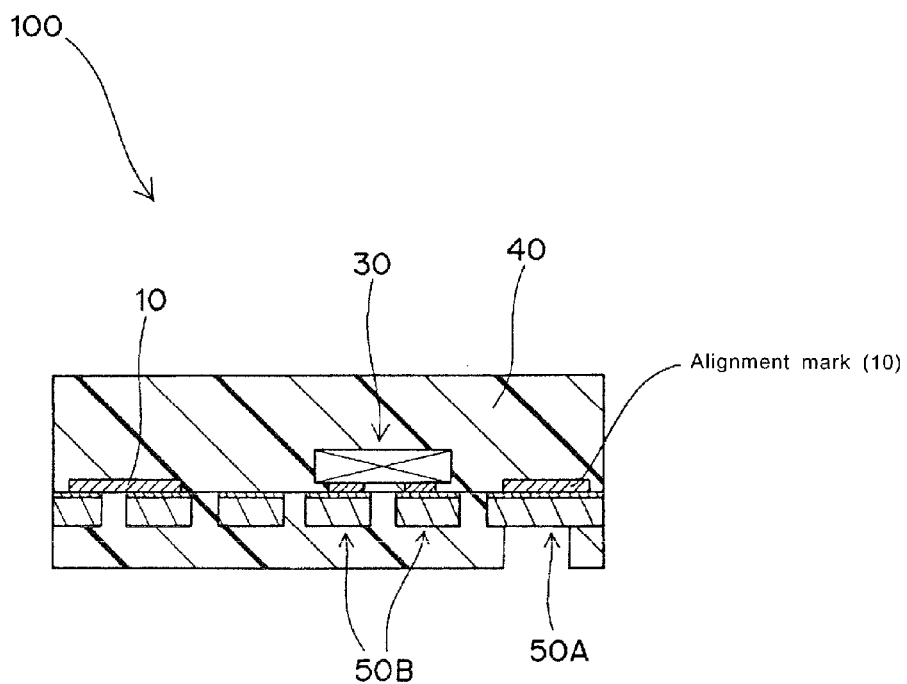
FIG. 8 is a cross-sectional view schematically illustrating a configuration of an electronic component package wherein a metal pattern portion serving as an alignment mark is buried in a sealing resin layer.

In a case where the metal pattern layer 10 is used as the cognition pattern during the manufacturing process of the package, at least a part of the metal pattern layer 10 includes a pattern portion serving as an alignment mark. More specifically, the alignment mark, i.e., a pattern portion 10 of the metal pattern layer is in an embedded in the sealing resin layer 40, as shown in FIG. 8. Preferably, the embedded metal pattern layer serving as the alignment mark is flush with the sealing resin layer 40.

In the package according to an embodiment of the present invention, one or more kinds of the electronic component 30 is in an embedded in the sealing resin layer 40. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like. According to a preferred embodiment of the present invention, the electrode 35 of the electronic component is in an exposed state at the surface of the sealing resin layer 40, and the metal plating pattern layer "B" 50B is in contact with the exposed electrode 35 of the electronic component.

In the package according to an embodiment of the present invention, the metal pattern layer and the electrode of the electronic component are in an electrical connection with each other via at least a part of the metal plating pattern layers "A" and "B". This leads to an provision of an desired wiring form. In other words, a suitable wiring form enables the metal plating pattern layers A(50A) and B(50B) to be in an electrical connection with each other, and thereby the metal pattern layer 10 and the electrode 35 of the electronic component are in an indirect connection with each other. With this wiring form, the heat from the electronic component, if any, can be suitably released through the metal plating pattern layers A, B and the metal pattern layer.

The sealing resin layer 40, in which the metal pattern layer and the electronic component are embedded, comprises an epoxy-based resin or a silicone-based resin, for example. The thickness of the sealing resin layer is preferably in the approximate range of 0.5 mm to 5.0 mm, and more preferably in the approximate range of 1.2 mm to 1.8 mm.

In a case where the layer "a" is provided as the dry plating layer in the electronic component package according to an embodiment of the present invention, the layer "a" (50A', 50B') preferably comprises at least one kind of metal material selected from the group consisting of Ti (titanium), Cr (chromium) and Ni (nickel). Alternatively, the layer "a" (50A', 50B') may comprise other metal material, for example at least one metal material selected from the group consisting of Ag (silver), Al (aluminum), Al alloy, Au (gold), Pt (platinum), Sn (tin), Cu (copper), W (tungsten) and the like. The layer "a" (50A', 50B') may serve as a stress-relaxation layer, which may improve the connection reliability of the electronic component package. While on the other hand, in a case where the layer "b" is provided as the wet plating layer in the electronic component package according to an embodiment of the present invention, the layer "b" (50A", 50B") preferably comprises at least one kind of metal material selected from the group consisting of Cu (copper) and Al (aluminum). Alternatively, the layer "b" (50A", 50B") may comprise other metal material, for example at least one metal material selected from the group consisting of Ag (silver), Pd (palladium), platinum (Pt) and nickel (Ni). However, when focusing on "heat releasing" in particular, it is preferred that the material of the layer "b" (50A", 50B") has high thermal conductivity which effectively contributes to the heat releasing of the package. In this regard, the material of the layer "b" (50A", 50B") preferably comprises the copper (Cu).

The dry plating layer "a" (50A', 50B') has a very thin form, and preferably has the thickness of nano-order, whereas the wet plating layer "b" (50A", 50B") has a thick form, and preferably has the thickness of micron-order. This means that most of the metal plating pattern layers "A" and "B" (50A, 50B) consists of the wet plating layer. By way of example, the thickness of the dry plating layer "a" (50A', 50B') is preferably in the range of 100 nm to 3000 nm (for example, thickness 300 nm of Ti plus thickness 1000 nm of Cu), the thickness of the wet plating layer "b" (50A", 50B") is preferably in the approximate range of 18 µm to 500 µm, more preferably in the approximate range of 35 µm to 250 µm, most preferably in the approximate range of 35 µm to 125 µm. As such, the layer "b" (50A", 50B") is thick, and thereby the large thickness of the metal plating pattern layers "A" and "B" (50A, 50B) can be suitably achieved.

Figure 9:
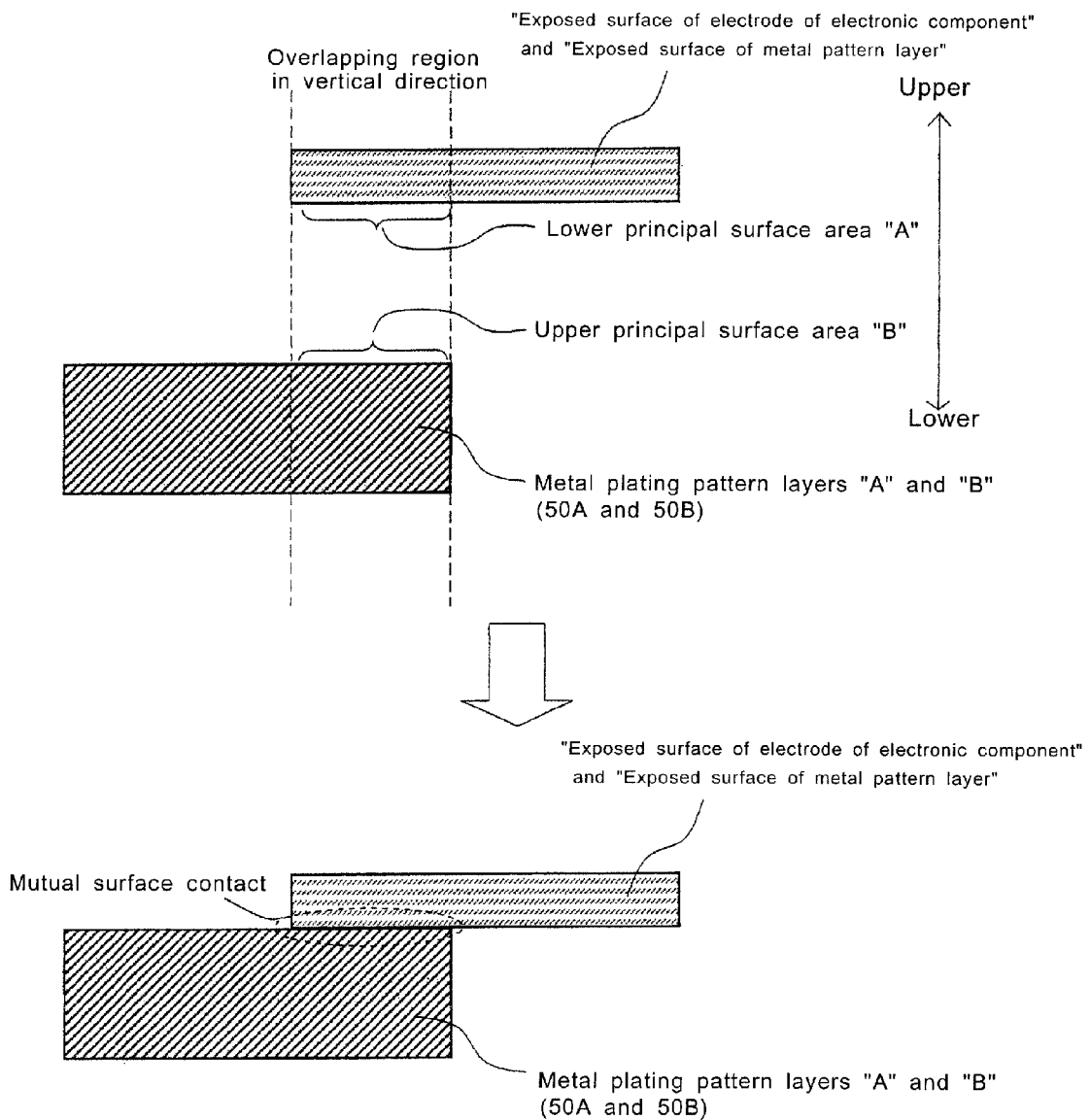
FIG. 9 includes schematic views for explaining "surface contact" (i.e., "direct bonding"/"surface bonding") according to an embodiment of the present invention.

As seen from FIG. 6, the metal plating pattern layer "A" 50A and the metal pattern layer 10 (directly) have mutual surface contact (or direct bonding/surface bonding) with each other in the electronic component package 100. As such, the metal plating pattern layer "A" 50A and the metal pattern layer 10 are in an electrical connection with each other. In a case where the layer "a" is provided as the dry plating layer, and the layer "b" is provided as the wet plating layer, the dry plating layer "a" 50A' of the metal plating pattern layer "A" 50A is such a thin layer that exhibits the negligible thermal resistance or electrical resistance. It can be thus considered in the present invention that the thick wet plating layer 50A" of the metal plating pattern layer "A" 50A is in direct surface contact (or direct bonding/surface bonding) with the metal pattern layer 10. Similarly, the metal plating pattern layer "B" 50B and the electronic component 30, especially the electrode 35 thereof (directly) have mutual surface contact (or direct bonding/surface bonding) with each other. As such, the metal plating pattern layer "B" 50B and the electronic component 30 are in an electrical connection with each other. The dry plating layer 50B' of the metal plating pattern layer "B" 50B is also such a thin layer that exhibits the negligible thermal resistance or electrical resistance. It can be thus considered in the present invention that the thick wet plating layer 50B" of the metal plating pattern layer "B" 50B is in direct surface contact (or direct bonding/surface bonding) with the electronic component, especially the electrode 35 thereof. The term "surface contact" (or direct bonding/surface bonding) used herein means an embodiment wherein principal surfaces (upper and lower surfaces) of respective ones of the objects are contacted or bonded with each other, in particular an embodiment wherein overlapping regions between the principal surfaces (upper and lower surfaces) of respective ones of the objects are all contacted with each other. More specifically, the term "surface contact" (or direct bonding/surface bonding) means an embodiment wherein the overlapping regions between "principal surface of the metal pattern layer (i.e., lower principal surface thereof exposed at the sealing resin layer)" and "principal surface (i.e., upper principal surface) of the metal plating pattern layer A" are all contacted with each other, or an embodiment wherein the overlapping regions between "principal surface of the electronic component (i.e., lower principal surface of the electrode thereof, exposed at the sealing resin layer)" and "principal surface (i.e., upper principal surface) of the metal plating pattern layer B" are all contacted with each other. In other words, the term "surface contact (or direct bonding/surface bonding)" used herein means an embodiment wherein the mutual overlapping regions of the metal plating pattern layer A and the metal pattern layer are all contacted, or an embodiment wherein the mutual overlapping regions of the metal plating pattern layer B and the electronic component (especially electrode thereof) are all contacted, which corresponds to an embodiment shown in FIG. 9 where the lower principal surface area "A" and the upper principal surface area "B" are all contacted with each other.

Due to the thick metal plating pattern layer provided based on "direct bonding or surface contact", the electronic component package can have an improved mechanical strength as a whole. As a result, the metal plating pattern layers "A" and "B" (50A, 50B) can serve as a supporting layer for the electronic component and/or the metal pattern layer. Furthermore, due to "surface contact" (or direct bonding/surface bonding), the metal plating pattern layer is capable of effectively releasing the heat from the electronic component via such metal plating pattern layer to the outside. That is, the metal plating pattern layers "A" and "B" serve not only as the supporting layer of the package, but also as a heat sink which effectively contributes to the high-heat releasing performance of the package.

As for the heat sink of the electronic component package, at least a part of the metal pattern layer 10, the metal plating pattern layers "A" 50A and/or "B" 50B can serve as a heat-releasing part of the package. In other words, the metal plating pattern layer "A" 50A, the metal plating pattern layer "B" 50B, and/or the metal pattern layer 10 embedded in the sealing resin layer, all of which are in direct or indirect connection with the electrode of the electronic component, can be used as the heat-releasing part in the electronic component package.

Due to the high heat-releasing of the package, a performance, an operating lifetime and the like of the electronic component can be increased, and also degeneration and discoloration of the sealing resin, which are attributed to the heat, can be effectively prevented. Furthermore, due to the "surface contact" (or direct bonding/surface bonding), the electric resistance of the package is more desirable than that of the case of the electrical connection via bump or wire. As such, the package according to an embodiment of the present invention enables a larger electric current to be applied therein. For example, in a case of the light-emitting package (e.g., LED package), the higher luminance can be achieved due to the high heat-releasing and the large electric current.

The package according to an embodiment of the present invention may be provided with a resist layer in order to achieve an more preferred form as a package product. In this regard, the electronic component package may comprise a resist layer provided with respect to the metal plating pattern layers "A" and "B". More specifically, it is preferred as shown in FIG. 6 that the solder resist layer 60 can be provided such that the metal plating pattern layers "A" 50A and "B" 50B are partially covered with the resist layer 60. The resist layer 60 in itself may be the same as that generally provided in the electronics packaging field.

In a case where a light-emitting element is included as the electronic component, and thus the electronic component package is a light-emitting element package, a fluorescent layer and a transparent resin layer are preferably provided. Instead of the sealing resin layer in which the metal pattern layer and the electronic component are embedded, it is preferred as shown in FIG. 10 that the fluorescent layer 44 is provided on the light-emitting element, and also the transparent resin layer 46 is provided such that the light-emitting element 30 and the fluorescent layer 44 are covered with the transparent resin layer. This makes it possible to achieve a more preferred form of the electronic component package 100 as the light-emitting element package. The material and thickness for the fluorescent layer and the transparent resin layer may be the same as those conventionally used in the general LED packages. The term "light-emitting element" used herein substantially means an element capable of emitting light. Examples of the light-emitting element include a light-emitting diode (LED) and an electronic component equipped therewith. As such, the term "light-emitting element" as used herein means not only a "bare chip type LED (i.e., LED chip)" but also a "discrete type light-emitting element wherein a molding of the LED chip is provided". The LED chip may also be a semiconductor laser chip.

In a case where of the package including the light-emitting element as the electronic component, the layer "a" 50B' (e.g., dry plating layer) of the metal plating pattern layers "B" 50B can be suitably used as a reflective layer. In this case, the reflective layer is located beneath the light-emitting element such that they are adjacent to each other. The downward light emitted from the light-emitting element can be reflected by this reflective layer (i.e., the dry plating layer of the metal plating pattern layer B). As a result, the downward light emitted from the light-emitting element can be eventually reoriented upwardly by the reflective layer. When the high reflectivity is an important consideration, the layer "a" of the metal plating pattern layers "B" 50B preferably comprises metal material selected from the group of Ag (silver) and Al (aluminum).

It should be noted that the present invention as described above includes the following aspects:

The first aspect: A method for manufacturing an electronic component package, the method comprising the steps:

(i) disposing a metal pattern layer on an adhesive carrier such that the metal pattern layer is attached to the adhesive carrier;

(ii) placing at least one kind of electronic component on the adhesive carrier such that the electronic component is attached to the adhesive carrier, the placed electronic component being not overlapped with respect to the metal pattern layer on the adhesive carrier;

(iii) forming a sealing resin layer on the adhesive carrier such that the metal pattern layer and the electronic component are covered with the sealing resin layer, whereby a precursor of the electronic component package is produced;

(iv) peeling off the adhesive carrier of the precursor, whereby the metal pattern layer and an electrode of the electronic component are exposed at the surface of the sealing resin layer; and (v) forming a metal plating layer such that the metal plating layer is in contact with the exposed surface of the metal pattern layer and the exposed surface of the electrode of the electronic component, wherein, in the step (v), a dry plating process and a subsequent wet plating process are performed to form the metal plating layer.

The second aspect: The method according to the first aspect, wherein, upon the peeling in the step (iv), the presence of the metal pattern layer improves an overall detachability of the adhesive carrier with respect to the sealing resin layer, the metal pattern layer being inter-positioned locally between the sealing resin layer and the adhesive carrier.

The third aspect: The method according to the second aspect, wherein the metal pattern layer has a gloss surface; and the gloss surface of the metal pattern layer is in a contact with the adhesive carrier at a point in time before the peeling of the adhesive carrier.

The fourth aspect: The method according to the second or third aspect, wherein the metal pattern layer has a roughened surface; and the metal pattern layer is covered with the sealing resin layer such that the roughened surface of the metal pattern layer is in contact with the sealing resin layer.

The fifth aspect: The method according to any one of the first to fourth aspects, wherein, in the step (v), a sputtering is performed as the dry plating process, whereas an electroplating is performed as the wet plating process.

The sixth aspect: The method according to any one of the first to fifth aspects, wherein, in the step (v), the dry plating layer with its thickness of 100 nm to 3000 nm (e.g., thickness of 100 nm to 2000 nm or 100 nm to 1000 nm) is formed by the dry plating process, the wet plating layer with its thickness of 18 µm to 500 µm is formed by the wet plating process.

The seventh aspect: The method according to any one of the first to sixth aspects, wherein at least a part of the metal pattern layer is used as an alignment mark.

The eighth aspect: The method according to the seventh aspect, wherein the alignment mark is used for positioning the electronic component upon the placing thereof in the step (ii).

The ninth aspect: The method according to any one of the first to eighth aspects, wherein the metal plating layer is subjected to a patterning treatment to at least form a metal plating pattern layer "A" and a metal plating pattern layer "B" therefrom, the metal plating pattern layer "A" being in contact with the exposed surface of the metal pattern layer, the metal plating pattern layer "B" being in contact with the exposed surface of the electrode of the electronic component.

The tenth aspect: The method according to the ninth aspect, further comprising the step of forming a resist layer with respect to the metal plating pattern layer "A" and the metal plating pattern layer "B".

The eleventh aspect: The method according to any one of the first to tenth aspects, wherein a plurality of the electronic component packages are manufactured concurrently;

in the step (i), as the metal pattern layer disposed on the adhesive carrier, a metal pattern layer with a plurality of electronic component-disposing regions included therein is used; and in the step (ii), electronic components to be used for respective ones of the electronic component packages are placed in the respective ones of the electronic component-disposing regions of the metal pattern layer.

The twelfth aspect: The method according to the eleventh aspect, further comprising the step for performing a dicing operation to divide the electronic component-disposing regions of the metal pattern layer into respectively-separated regions.

The thirteenth aspect: The method according to any one of the first to twelfth aspects, wherein a patterned metal foil, which has been preliminarily patterned, is attached to the adhesive carrier in the step (i) to dispose the metal pattern layer on the adhesive carrier.

The fourteenth aspect: The method according to any one of the first to twelfth aspects, wherein a metal foil or a metal layer is attached to the adhesive, followed by being subjected to a patterning treatment to dispose the metal pattern layer on the adhesive carrier in the step (i).

The fifteenth aspect: The method according to any one of the first to fourteenth aspects, wherein a carrier sheet is used as the adhesive carrier, the carrier sheet having a two-layered structure in which an adhesive layer is provided on a supporting base.

The sixteenth aspect: The method according to any one of the first to fifteenth aspects, wherein a light-emitting element is included as the electronic component to be placed in the step (ii); and instead of forming the sealing resin layer in the step (iii), a fluorescent layer is formed on the light-emitting element, and thereafter a transparent resin layer is formed to cover the light-emitting element and the fluorescent layer.

The seventeenth aspect: The method according to any one of the first to sixteenth aspects, wherein a layer "a" with a relatively small average crystal grain size is formed by the dry plating process, and thereafter a layer "b" with a relatively large average crystal grain size is formed by the wet plating process.

The eighteenth aspect: The method according to any one of the seventeenth aspect, wherein the average crystal grain size of the layer "a" is 2 µm or lower, whereas the average crystal grain size of the layer "b" is 5 µm or higher.

The nineteenth aspect: An electronic component package, comprising:

a sealing resin layer;

a metal pattern layer and at least one kind of electronic component, the metal pattern layer and the electronic component being buried in the sealing resin layer; and a metal plating pattern layer "A" and a metal plating pattern layer "B", the layer "A" being in contact with the metal pattern layer, the layer "B" being in contact with the electronic component, wherein the sealing resin layer includes the metal pattern layer and an electrode of the electronic component buried in the sealing resin layer such that the buried metal pattern layer and the buried electrode are flush with the sealing resin layer, wherein each of the metal plating pattern layers "A" and "B" has a two-layered structure of a wet plating layer located relatively outside and a dry plating layer located relatively inside.

The twentieth aspect: The electronic component package according to the nineteenth aspect, wherein the metal pattern layer and the electrode of the electronic component are in an electrical connection with each other via at least a part of the metal plating pattern layers "A" and "B".

The twenty-first aspect: The electronic component package according to the nineteenth or twentieth aspect, wherein at least a part of the metal pattern layer, the metal plating pattern layers "A" and/or "B" serves as a heat-releasing part of the electronic component package.

The twenty-second aspect: The electronic component package according to the nineteenth or twenty-first aspect, wherein the dry plating layer comprises at least one kind of a metal material selected from a group consisting of Ti, Cr and Ni, whereas, the wet plating layer comprises at least one kind of a metal material selected from a group consisting of Cu, Ni and Al.

The twenty-third aspect: The electronic component package according to any one of the nineteenth to twenty-second aspects, wherein the dry plating layer has a thickness of 100 nm to 3000 nm (e.g., 100 nm to 2000 nm), whereas the wet plating layer has a thickness of 18 µm to 500 µm.

The twenty-fourth aspect: The electronic component package according to any one of the nineteenth to twenty-third aspects, wherein the metal pattern layer has a gloss surface, and the sealing resin layer includes the metal pattern layer buried therein such that the gloss surface of the metal pattern layer is flush with the sealing resin layer.

The twenty-fifth aspect: The electronic component package according to any one of the nineteenth to twenty-fourth aspects, wherein the metal pattern layer has a roughened surface, and the sealing resin layer includes the metal pattern layer buried therein such that the roughened surface of the metal pattern layer is in contact with the sealing resin layer.

The twenty-sixth aspect: The electronic component package according to any one of the nineteenth to twenty-fifth aspects, wherein at least a part of the metal pattern layer is an alignment mark.

The twenty-seventh aspect: The electronic component package according to any one of the nineteenth to twenty-sixth aspects, further comprising a resist layer provided with respect to the metal plating pattern layers "A" and "B".

The twenty-eighth aspect: The electronic component package according to any one of the nineteenth to twenty-seventh aspects, wherein a light-emitting element is provided as the electronic component, and instead of the sealing resin layer, a fluorescent layer is provided on the light-emitting element, and also a transparent resin layer is provided such that the light-emitting element and the fluorescent layer are covered with the transparent resin layer.

The twenty-ninth aspect: The electronic component package according to any one of the nineteenth to twenty-eighth aspects, wherein the dry plating layer is a layer "a" with a relatively small average crystal grain size, whereas the wet plating layer is a layer "b" with a relatively large average crystal grain size.

The thirtieth aspect: The electronic component package according to the twenty-ninth, aspect, wherein the average crystal grain size of the layer "a" is 2 μm or lower, whereas the average crystal grain size of the layer "b" is 5 μm or higher.

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

For example, the peeled adhesive carrier, which has been already removed from the precursor, may be re-used. That is, the used adhesive carrier can be used for the manufacturing of another electronic component package at a later stage.

EXAMPLES

The electronic component package was manufactured according to an embodiment of the present invention.

(Material for Package)

The "adhesive carrier (adhesive film)", "sealing resin layer" and "metal pattern layer (copper foil)" used for the manufacturing of the package were as follows.

| | |
|---|---|
| Adhesive carrier (Adhesive film) | Single-faced adhesive tape (adhesive layer: about 15 um and polyester film: about 200 um) about 200 mm × about 200 mm |
| Sealing resin layer | Liquid epoxy resin |
| Copper foil (metal pattern layer/ copper foil for cognizing component) | Copper foil (about 18 um) with gloss surface on one face and roughened surface on the other face, i.e., resin side face |

The electronic component package was obtained after the following processes.

| | |
|---|---|
| Lamination | Lamination of copper foil on adhesive film (such that gloss surface of copper foil is in contact with adhesive film). |
| DFR lamination | Lamination of dry film resist on adhesive film having copper foil (single face lamination). |
| Development | Development of DFR with alkaline developer. |
| Etching | Etching of copper foil with ferric chloride solution. |
| Removal | Swelling removal of DFR with alkaline stripping liquid. |
| Mounting | Mounting of electronic component (especially, placing of electronic component with reference to patterned portion of copper foil). |
| Sealing resin preparation | Metering of predetermined amount of liquid epoxy rein, and then filling die therewith |
| Vacuum heat press | Charging die in heat press (heated at about 50° C.), and decompression into a pressure of about -0.1 MPa by vacuum pump, followed by holding it for about five minutes. Then, heating up to about 120° C. and pressurizing up to about 0.1 MPa, followed by holding it for about 15 minutes. |
| Demolding | Removal of die from heat press, followed by cooling thereof. Then, sample was taken out from die. |
| After-cure | Complete curing by dryer (about 150° C.) for about 60 minutes (in the air). |
| Peeling | Peeling of adhesive film to provide precursor (alternatively, peeling may be performed before "afer-cure"). |
| Sputtering (Ti/Cu) | Providing precursor in sputtering apparatus. Then, reverse sputtering plus Ti sputtering (about 200 Å), and Cu sputtering (about 1000 Å) |
| Electrolytic Cu plating | Electrolytic Cu plating to provide desired thickness (up to about 35 um) of plating layer. |
| Liquid resist formation | Application of liquid resist ink by spin-coater. Drying until no tack is provided. |
| Development | Development of liquid resist with alkaline developer. |
| Etching | Etching of Cu with ferric chloride solution. Then, removal of Ti layer with Ti etching liquid. |
| Removal | Removal of liquid resist with alkaline stripping liquid |
| Soder resist application | Screen printing of photosensitive solder resist print ink. Heat treatment until no adhesiveness is provided. |
| Development | UV irradiation via pattenred film, followed by development. |
| Curing | Complete cure of SR by heat treatment. |
| Dicing | Cut into pieces with desired size by blade (with its width dimension of about 0.2 mm) of dicer device. |
| Stamping | Stamping of serial number on surface of sealing resin. |
| Inspection | Examining of electrical function. |
| Completion | Completion |

As a result of the above processes, there was able to be obtained the package with "substrate-less", "wire bonding-less/bump-less", "solder material-less". It was confirmed that the presence of the metal pattern layer locally located between the sealing resin layer and the adhesive carrier facilitated the peeling operation. It was also confirmed that the bump-less thick metal plating layer was formed with respect to "exposed surface of metal pattern layer" and "exposed surface of electrode of electronic component" (both of the exposed surfaces having been provided by the peeling of the adhesive carrier), the the thick metal plating layer being capable of serving suitably as a heat sink.

INDUSTRIAL APPLICABILITY

The present invention can be suitably used in various applications of electronics packaging field. For example, the present invention can be suitably available in an electric source package (e.g., POL converter such as voltage step down converter), a LED package, a module with a built-in component.

CROSS REFERENCE TO RELATED PATENT APPLICATION

The present application claims the right of priorities of Japan patent application No. 2012-190075 (filing date: Aug. 30, 2012, title of the invention: ELECTRONIC COMPONENT PACKAGE AND METHOD FOR MANUFACTURING THE SAME) and Japan patent application No. 2012-195161 (filing date: Sep. 5, 2012, title of the invention: SEMICONDUCTOR DEVICE AND METHOD FOR MANUFACTURING THE SAME), the whole contents of which are incorporated herein by reference.

EXPLANATION OF REFERENCE NUMERALS

10 Metal pattern layer
10A Gloss surface of metal pattern layer
10B Roughened surface of metal pattern layer
20 Adhesive carrier
24 Supporting base of adhesive carrier
26 Adhesive layer of adhesive carrier
30 Electronic component
35 Electrode of electronic component
40 Sealing resin layer
44 Fluorescent layer
46 Transparent resin layer
50 Metal plating layer
50A Metal plating pattern layer "A"
50B Metal plating pattern layer "B"
50' Layer "a" (e.g., dry plating layer)
50A' Layer "a" of metal plating pattern layer "A" (e.g., dry plating layer)
50B' Layer "a" of metal plating pattern layer "B" (e.g., dry plating layer)
50" Layer "b" (e.g., wet plating layer)
50A" Layer "b" of metal plating pattern layer "A" (e.g., wet plating layer)
50B" Layer "b" of metal plating pattern layer "B" (e.g., wet plating layer)
60 Resist layer
100' Precursor of electronic component package
100 Electronic component package

The invention claimed is:

1. A method for manufacturing at least one electronic component package, the method comprising:

(i) disposing a metal pattern layer on an adhesive carrier such that the metal pattern layer is attached to the adhesive carrier;

(ii) disposing at least one electronic component on the adhesive carrier such that the electronic component is attached to the adhesive carrier, the at least one electronic component not being overlapped with the metal pattern layer on the adhesive carrier;

(iii) forming a sealing resin layer, which covers the metal pattern layer and the electronic component, on the adhesive carrier to obtain a precursor including the metal pattern layer, the at least one electronic component, and the sealing resin layer;

(iv) peeling the adhesive carrier off of the precursor, so that a surface of the metal pattern layer and a surface of an electrode of the electronic component are exposed from a surface of the sealing resin layer;

(v) forming a first metal plating layer on the exposed surface of the metal pattern layer and the exposed surface of the electrode of the electronic component, the first metal plating layer having a thickness of 100 nm to 3,000 nm; and (vi) forming a second metal plating layer on the first metal plating layer, the second metal plating layer having a thickness of 18 μm to 500 μm, wherein an average crystal grain size of the second metal plating layer is larger than an average crystal grain size of the first metal plating layer.

2. The method according to claim 1, wherein the average crystal grain size of the first metal plating layer is 2 μm or lower, and the average crystal grain size of the second metal plating layer is 5 μm or higher.

3. The method according to claim 1, wherein the first metal plating layer is formed by a dry plating process, and the second metal plating layer is formed by a wet plating process.

4. The method according to claim 3, wherein the dry plating process is a sputtering process, and the wet plating process is an electroplating process.

5. The method according to claim 1, wherein the metal pattern layer has a gloss surface; and
wherein the disposing of the metal pattern layer on the adhesive carrier comprises disposing the gloss surface of the metal pattern layer on the adhesive carrier such that the gloss surface is in contact with the adhesive carrier.

6. The method according to claim 1, wherein the metal pattern layer has a roughened surface; and
wherein the forming of the sealing resin layer comprises forming the sealing resin layer such that the metal pattern layer is covered with the sealing resin layer and the roughened surface of the metal pattern layer is in contact with the sealing resin layer.

7. The method according to claim 1, wherein at least a part of the metal pattern layer is used as an alignment mark.

8. The method according to claim 7, wherein the alignment mark is used for positioning the at least one electronic component on the adhesive carrier during the disposing of the at least one electronic component.

9. The method according to claim 1, further comprising (vii) patterning the first and second metal plating layers to obtain at least one metal plating pattern layer,
wherein the at least one metal plating pattern layer includes
a first metal plating pattern layer in contact with the exposed surface of the metal pattern layer, and
a second the metal plating pattern layer in contact with the exposed surface of the electrode of the electronic component.

10. The method according to claim 9, further comprising (viii) forming a resist layer on the first metal plating pattern layer and the second metal plating pattern layer.

11. The method according to claim 1, wherein a plurality of the electronic component packages are manufactured concurrently;
the metal pattern layer defines a plurality of electronic component-disposing regions, each of the plurality of electronic component-disposing regions corresponding to one of the plurality of the electronic component packages; and
the disposing of the at least one electronic component comprises disposing a plurality of the electronic components respectively in the plurality of electronic component-disposing regions.

12. The method according to claim 11, further comprising (vii) performing a dicing operation to divide the electronic component-disposing regions into respectively-separated regions.

13. The method according to claim 1, wherein the disposing of the metal pattern layer on the adhesive carrier comprises preparing a patterned metal foil, and disposing the patterned metal foil as the metal pattern layer on the adhesive carrier.

14. The method according to claim 1, wherein the disposing of the metal pattern layer on the adhesive carrier comprises disposing a metal foil on the adhesive carrier, and patterning the metal foil to obtain the metal pattern layer.

15. The method according to claim 1, wherein the adhesive carrier is a carrier sheet including an adhesive layer and a supporting base.

16. The method according to claim 1, further comprising, after the disposing of the at least one electronic component on the adhesive carrier and before the forming of the sealing resin layer, forming a fluorescent layer on the at least one electronic component, wherein
the forming of the sealing resin layer further comprises forming the sealing resin layer, which covers the fluorescent layer,
the at least one electronic component is a light-emitting element, and
the sealing resin layer has light transparency.

17. The method according to claim 1, wherein a bonding property between the metal pattern layer and the adhesive carrier is weaker than a bonding property between the sealing resin layer and the adhesive carrier.

* * * * *